(12) United States Patent
Chen et al.

(10) Patent No.: US 6,426,298 B1
(45) Date of Patent: Jul. 30, 2002

(54) METHOD OF PATTERNING A DUAL DAMASCENE

(75) Inventors: Tong-Yu Chen, Hsin-Chu; Chan-Lon Yang, Taipei, both of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/637,811

(22) Filed: Aug. 11, 2000

(51) Int. Cl.$^7$ .................. H01L 21/311; H01L 21/302; H01L 21/3065

(52) U.S. Cl. .................. 438/699; 438/706; 438/723; 438/724

(58) Field of Search .................. 438/699, 706, 438/723, 724

(56) References Cited

U.S. PATENT DOCUMENTS

| | | | |
|---|---|---|---|
| 5,635,423 A | * | 6/1997 | Huang et al. ............. 438/638 |
| 5,741,626 A | * | 4/1998 | Jain et al. ................ 430/314 |
| 5,882,996 A | * | 3/1999 | Dai ........................ 438/597 |
| 5,933,761 A | * | 8/1999 | Lee ........................ 438/783 |
| 6,211,068 B1 | * | 4/2001 | Huang ..................... 438/634 |

* cited by examiner

Primary Examiner—Benjamin L. Utech
Assistant Examiner—Lynette T. Umez-Eronini
(74) Attorney, Agent, or Firm—Powell Goldstein Frazer & Murphy LLP

(57) ABSTRACT

A substrate is provided. A first dielectric is formed over the substrate, and an etching stop layer and a second dielectric are formed in turn on the first dielectric by deposition. An anti-reflection layer is formed over the second dielectric. Then, a photo-resist layer is formed and defined over the anti-reflection layer. A gap-filling material is filled on the second dielectric and into the via hole. Subsequently, the gap-filling material is etched back and is turned on the end point and the long over etch is applied to make sure the photo-resist thickness is below middle stop layer. If the first dielectric reacts with the photo-resist plug in the via hole, the bottom anti-reflection coating or thin oxide are used as a barrier before the trench photo-resist is patterned. If the first dielectric does not react with the photo-resist plug in the via hole, the trench photo-resist is patterned directly. Then, the trench etch is performed.

12 Claims, 8 Drawing Sheets

METHOD OF PATTERNING A DUAL DAMASCENE

BACKGROUND OF THE INVENTION

1. Field of the Invention

The present invention relates generally to a method for manufacturing the multi level interconnects of semiconductor devices, and more particularly to method of patterning a dual damascene.

2. Description of the Prior Art

When semiconductor devices for the integrated circuit (IC) become highly integrated, the surface of the chips cannot be supplied with enough area to make the interconnects. For matching up the requirement of interconnects increase with Complementary Metal-Oxide-Semiconductor (CMOS) devices shrinks, many designs of the integrated circuit have to use dual the damascene method. Moreover, it is using the three-dimensional structure of multi-level interconnects at present in the deep sub-micron region, and inter-metal dielectric (IMD) as the dielectric material which be used to separate from each of the interconnects. A conducting wire which connects up between the upper and the down metal layers is called the via plug in semiconductor industry. In general, if an opening which forms in the dielectric layer exposure to devices of the substrate in interconnects, it is called the via hole.

There are known two methods for conventional via and interconnect processes, one method is that via and interconnect finish by oneself, wherein the method is that the dielectric is first formed on the metal and then the photoresist layer (PR) is defined on the dielectric, and use the etching process to make the via, and deposit conduction material by means of deposition to finish the via process, then deposit and define metal layer, final, deposit the dielectric layer whereon. The conventional forming metal interconnect process is that make the via interconnect by means of two lithography process. This method requires cumbrous steps of depositing and patterning. And yet, it will result in interconnects to be difficult patterned due to the multi layer connect layout is more daedal in the sub-quarter micron.

Hence, damascene interconnect structure is developed at present. According to particular of the process, it will compartmentalize three types, such as the single type, the dual type and the self-aligned type. The damascene is that etch the trench of interconnects in the dielectric, and then fill the metal as interconnect. This method can introduce metal that is difficult etched into the semiconductor without etching in the interconnect process. Therefore, this invention is the best method of the interconnect process in the sub-quarter micron.

Conventional dual damascene include two patterns, one is the deep pattern, that is the via patterns; another is the shallow pattern or the line pattern, that is the trench patterns. Referring to FIG. 1A, first of all, a dielectric 12 is formed over on the substrate 10, and a etching stop layer 14 is formed over on the dielectric 12, then a dielectric 16 is formed over on the etching stop layer 14. And then a photo-resist layer 18 is formed on the dielectric 16, and the photo-resist layer 18 is patterned as a deep pattern area. As show in FIG. 1B, dry etching of the deep patterns is performed by means of the photo-resist layer 18 as a mask, then punch through the dielectric 16, etching stop layer 14 and the dielectric 12, and forming a via hole, then remove the photo-resist layer 18. As show in FIG. 1C, a photo-resist layer 22 is formed on the dielectric 16 by deposition, and it is defined to form a shallow pattern area, and the partial surface of the via 20 and the dielectric 16 are exposed, likewise, the horizontal size of the shallow patterns is large more then one of the deep patterns. As show in FIG. 1D, dry etching of the shallow patterns is proceed by means of the photo-resist layer 22 as a mask, and exposed partial surface of the dielectric 16 is removed to form a trench 24 having large horizontal size to take advantage of etching stop layer 14 is as a etching terminal point. As show in FIG. 1E, the photo-resist layer 22 is removed to form the opening of the damascene 20, 24. Final, proceed a interconnect process, since the above processes are well known in the prior art, which are not the focus of the present invention, hence will not be described in greater details.

The skill of the dual damascene is a method for forming via and interconnects. In the conventional dual damascene skill, it is found that has some photoresist plug (PR plug) at the via hole after the trench ADI (after develop inspection). If the photoresist plug is high enough that will be the hard mask during trench etching and to form some crown like oxide residue. Moreover, dry etching of the shallow pattern will produce the facet on the etching stop layer. These profiles will cause the no linear barrier for copper fill-in.

In accordance with the above description, a new and improved method for patterning the dual damascene is therefore necessary, so as to raise the yield and quality of the follow-up process.

SUMMARY OF THE INVENTION

In accordance with the present invention, a new method for patterning dual damascene process is provided that substantially overcomes drawbacks of the above mentioned problems which arise from conventional methods.

Accordingly, it is an object of the present invention to provide a new method for patterning the dual damascene, the present invention use the organic material to be as the gap-filling material, such as I-line and DUV photo-resist material and to be as the Low-K dielectric material, such as silk and flare.

The other object of the present invention is that provide a new method for patterning the dual damascene, the present invention can avoid to product the facet and photo-resist residue in the via hole while the trench is formed, so as to prevent become hard mask during the trench etching. Hence, some oxide residue like as crown is not formed at the bottom of the via hole. Thus, the method of the present invention is effective in raising quality of the process.

Another object of the present invention is to avoid over-etching of the via bottom and destroying the desired conduct electricity area by means of filling the gap-filling material in the via hole, and the copper barrier at the via bottom can be further thin down without any trench etch recipe tuning. Thus, the method of the present invention is easily and to conform to the economic effect, and it is suitable for use in the sub micron range.

A further object of the present invention is that it can use the photo-resist etch recipe to do photo-etch back, and turn on the end point and applying the long over etch to make sure the photo-resist thickness is below middle stop layer.

In accordance with the present invention, a new method for patterning the dual damascene is disclosed. In one embodiment of the present invention, a substrate is provided. A first inter-metal dielectric is formed over the substrate by deposition, and an etching stop layer and a second dielectric are formed in turn on the first dielectric by deposition. A anti-reflection layer (ARL) is formed over the second dielectric by deposition with the anti-reflection coating (ARC) to prevent the glisten of the surface to influence accuracy of the photo-resist exposure. On the whole, it is called the top anti-reflection coating (TARC) that the anti-reflection layer (ARL) is formed over the photo-resist layer; it is called the bottom anti-reflection coating (BARC) that the anti-reflection layer (ARL) is formed under the photo-resist layer. Then, a photo-resist layer is formed over the anti-reflection layer, and defining the photo-resist layer to be a deep pattern area. Then, a dry etching step of the deep pattern is carried out by means of the first photo-resist layer as the mask, and punch through in turn the anti-reflection layer, the second dielectric layer, the etch stop layer and the first dielectric layer to form a via hole, then the photo-resist layer is removed. A gap-filling materials filled on the second dielectric and into the via hole, wherein the gap-filling material is the organic material, such as I-line or DUV photo-resist material. Subsequently, etching back the gap-filling material and turn on the end point and applying the long over etch to make sure the photo-resist thickness is below middle stop layer.

If the inter-metal dielectric layers react with the second photo-resist layer that will be formed during pattern define process, a barrier layer will be conformably formed along the surface of the anti-reflection layer, the surface of the sidewalls at the via hole, and the surface of the photo-resist plug on the bottom of the via hole before the trench is patterned, wherein the barrier layer is such as the bottom anti-reflection coating or a thin oxide. Then, a second photo-resist layer is formed on the barrier layer, and the second photo-resist layer is defined to form a shallow pattern area and to expose the via hole and the partial surface of the barrier layer. Carrying out a dry etching process by using the second photo-resist as a mask, and etching stop layer being as an etching terminal point to remove exposed partial surface of the barrier layer so as to form a trench having large horizontal size than the via hole. Then, the second photo-resist layer, the barrier layer and photo-resist plug in the via hole are removed to form an opening of the damascene. Finally, an interconnect process is undertaken, since the above processes are well known in the prior art, which are not the focus of the present invention, hence will not be described in greater detail.

If the inter-metal dielectric layers will not react with the second photo-resist layer that will being formed during pattern define process, a second photo-resist layer is formed on the anti-reflection layer directly, and the second photo-resist layer is defined to form a shallow pattern area and to expose the via hole and the partial surface of the bottom anti-reflection layer. Carrying out a dry etching process by using the second photo-resist as a mask, and etching stop layer being as an etching terminal point to remove exposed partial surface of bottom anti-reflection layer so as to form a trench having large horizontal size than the via hole. Then, the second photo-resist layer and photo-resist plug in the via hole are removed to form an opening of the damascene. Finally, an interconnect process is undertaken, since the above processes are well known in the prior art, which are not the focus of the present invention, hence will not be described in greater detail.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 2A to 2I show cross-sectional views illustrative of various stages of the pattern method in the dual damascene in accordance with one embodiment of the present invention.

DESCRIPTION OF THE PREFERRED EMBODIMENT

Although specific embodiments have been illustrated and described, it will be obvious to those skilled in the art that various modifications may be made without departing from what is intended to be limited solely by the appended claims.

Figure 1A:
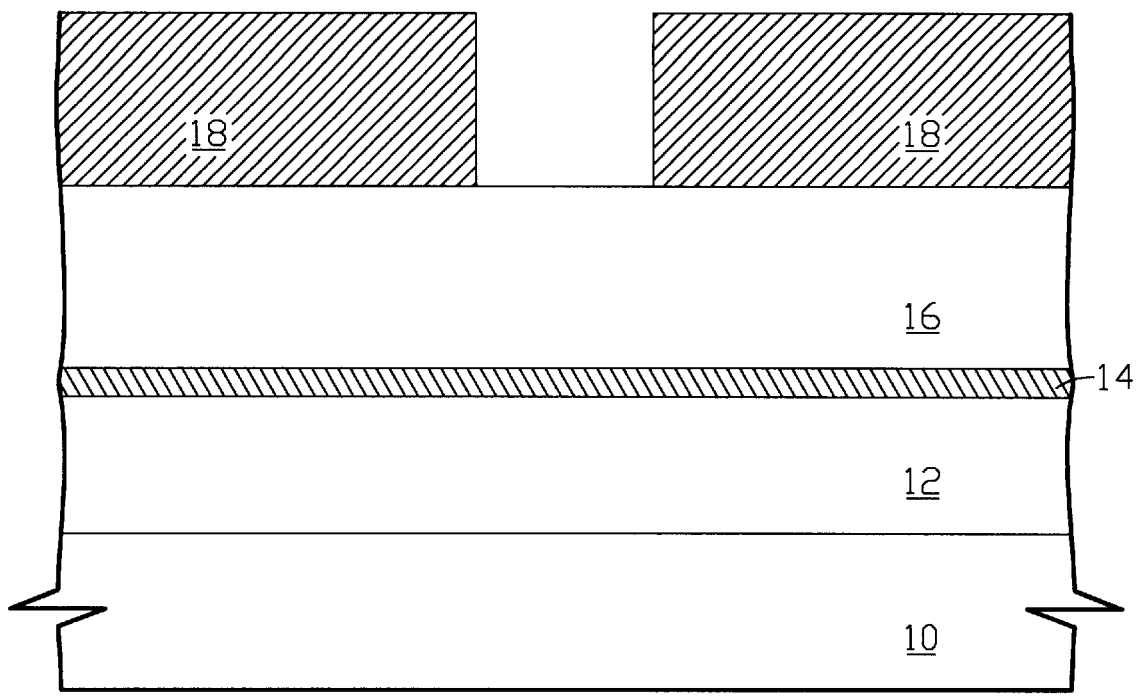
FIGS. 1A to 1E show cross-sectional views illustrative of various stages of conventional pattern method in the dual damascene.
Figure 1B:
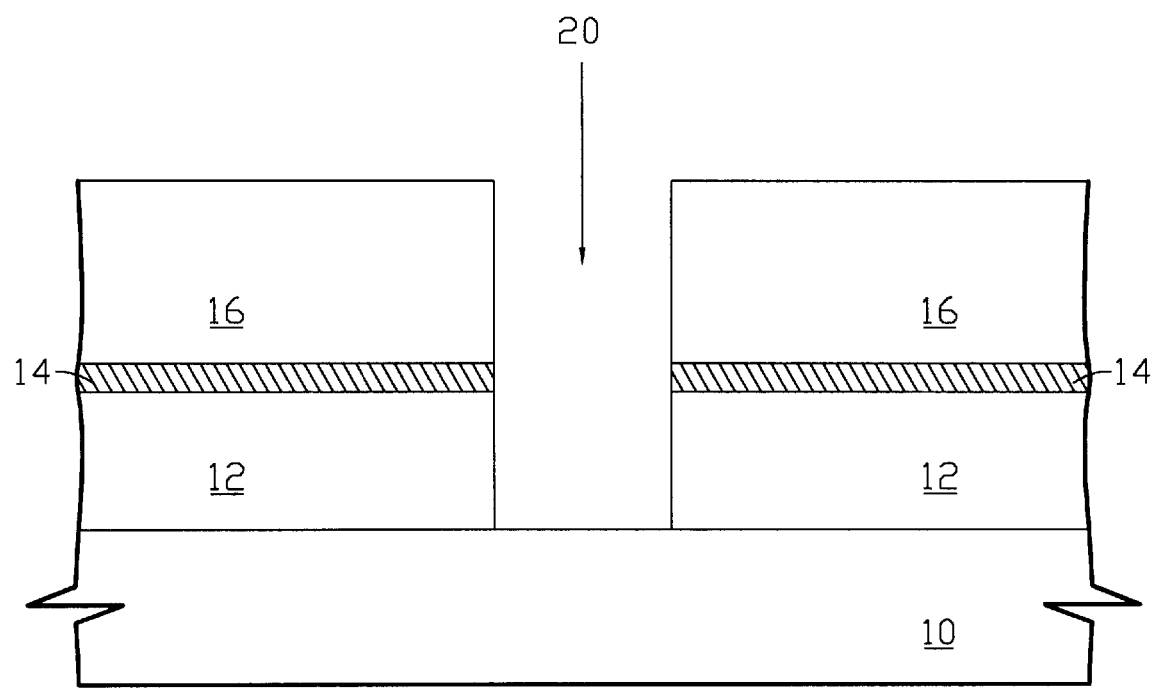
Figure 1C:
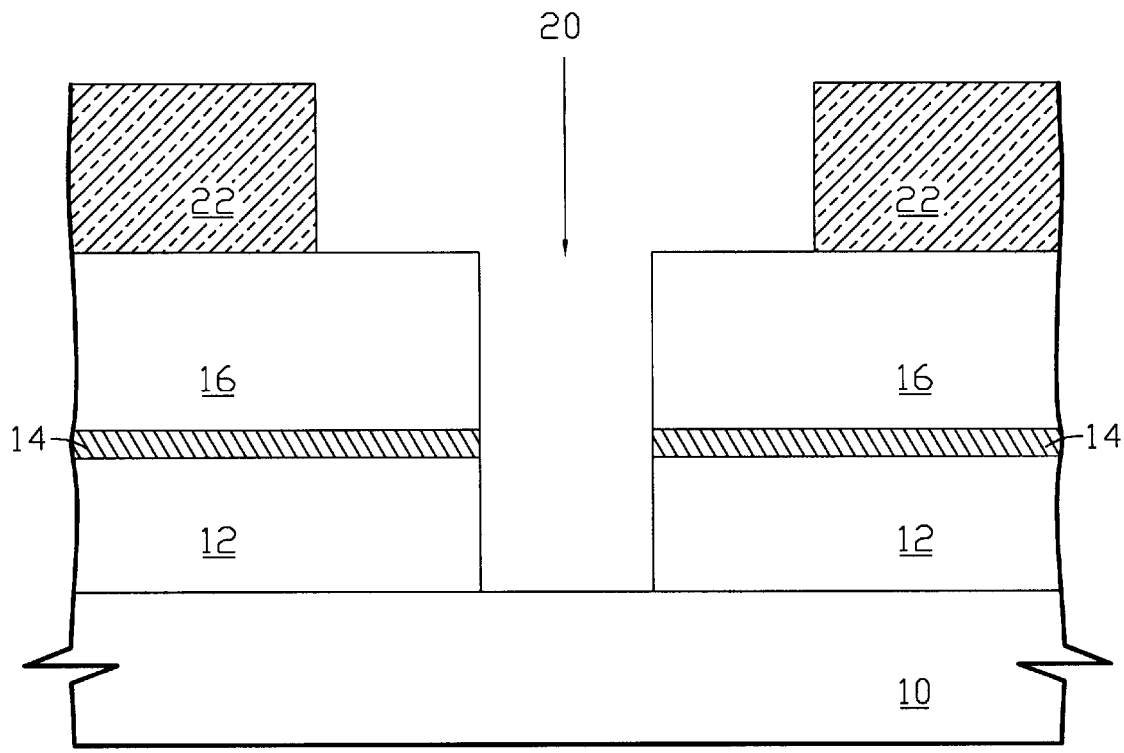
Figure 1D:
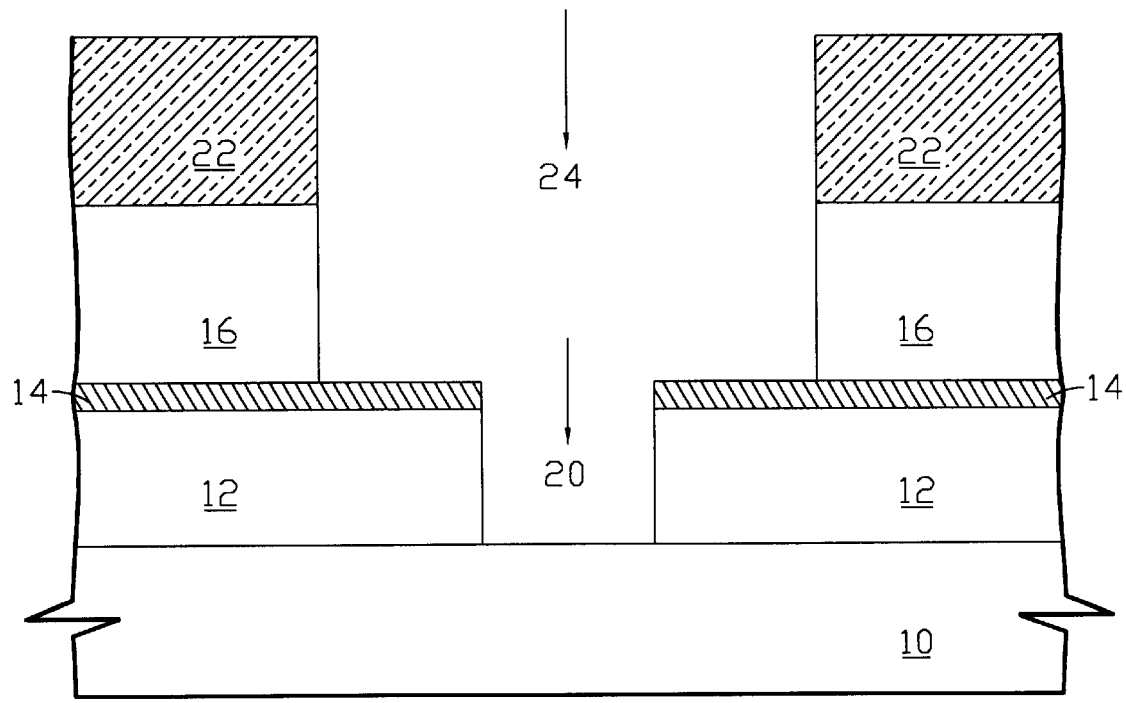
Figure 1E:
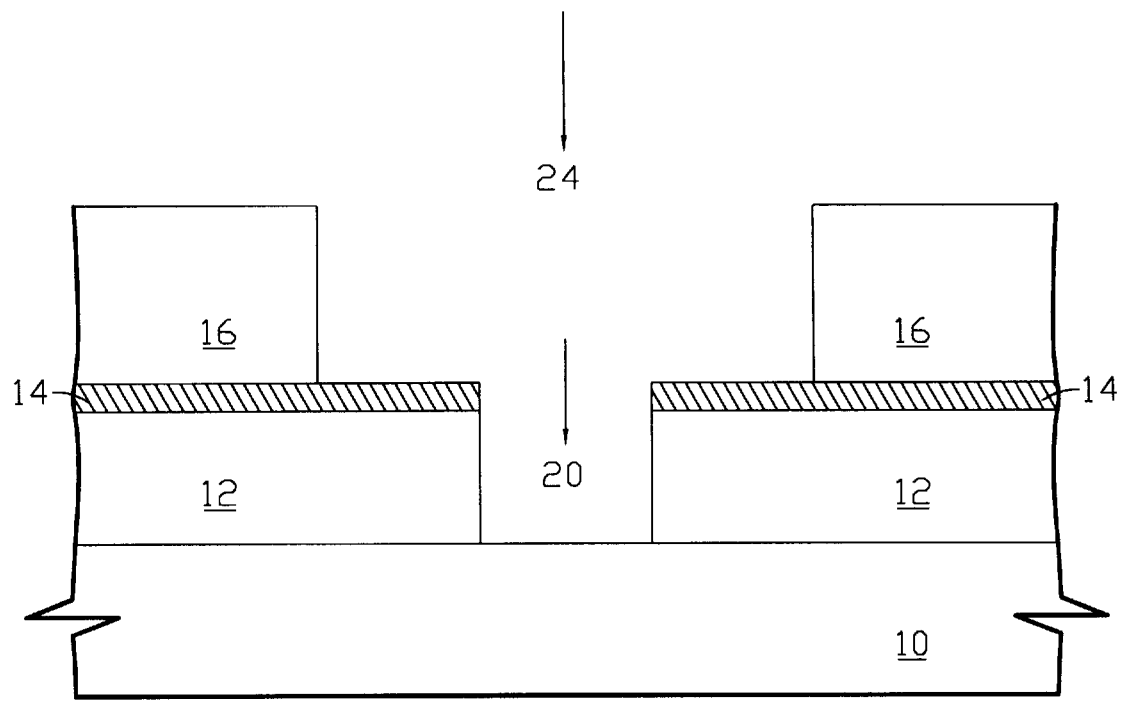
Figure 2A:
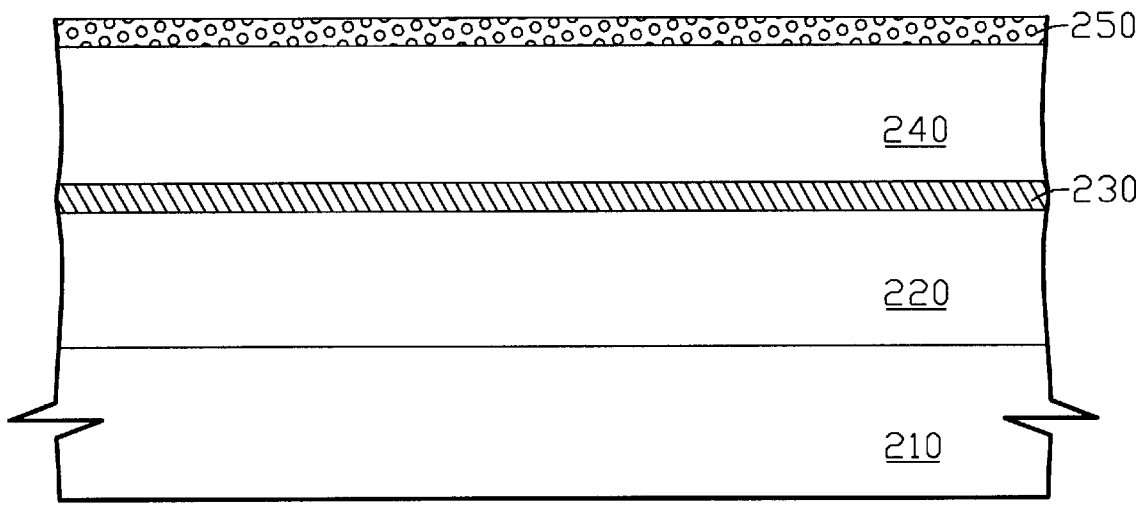

As illustrated in FIG. 2A, a substrate 210 is provided. First, a first inter-metal dielectric layer 220 is formed over the substrate 210, and a etching stop layer 230 and a second inter-metal dielectric layer 240 are formed in turn over the first inter-metal dielectric 220. A anti-reflection layer (ARL) 250 is formed over the second inter-metal dielectric 240 by using the anti-reflection coating (ARC) to prevent the glisten of the surface to influence accuracy of the photo-resist layer exposure. In this embodiment, the better material of the first inter-metal dielectric layer 220 is composed of organic low-K material, such as silk or flare, the better material of the second inter-metal dielectric layer 240 is composed of inorganic low-K material, such as MSQ/HSQ, and the better material of the etching stop layer 230 is such as SiON/SiC.

Figure 2B:
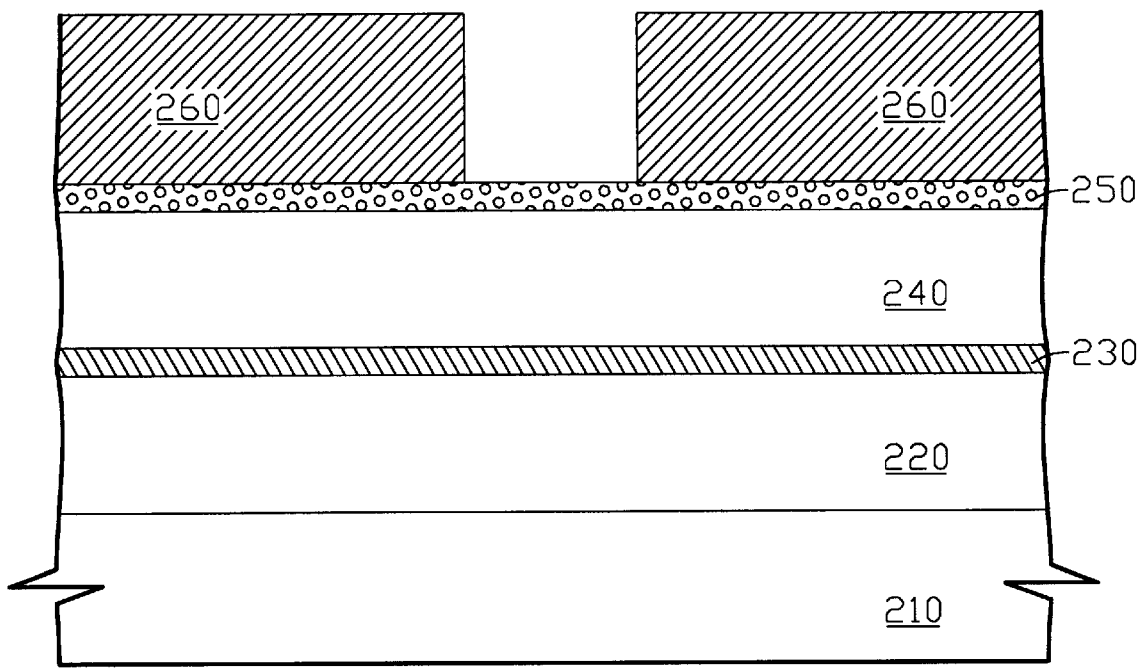
Figure 2C:
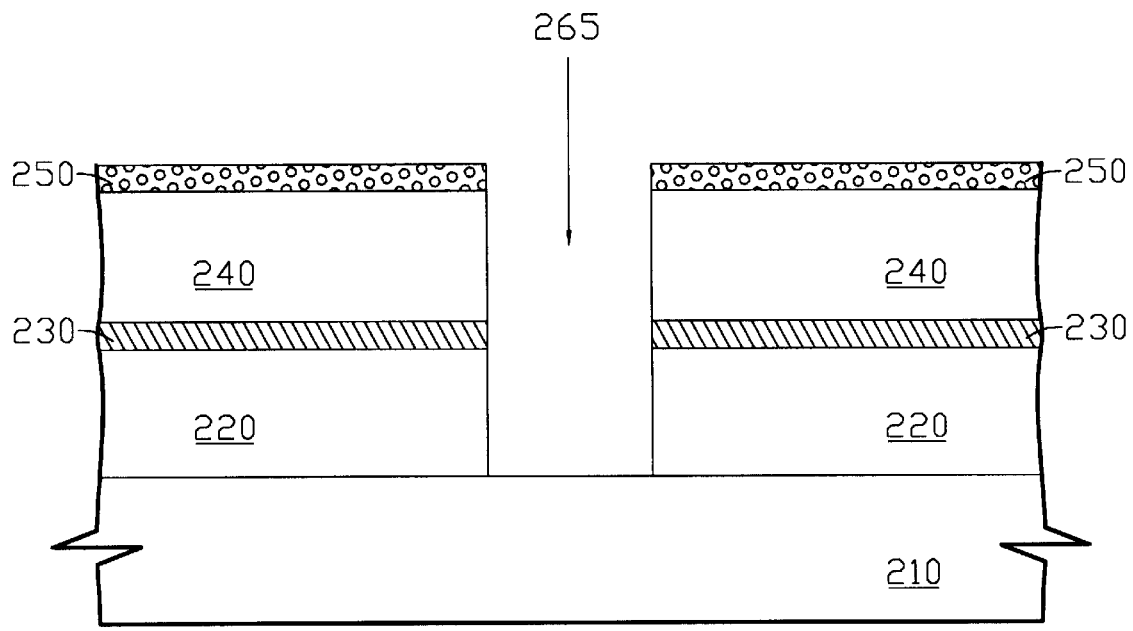

Referring to FIG. 2B, in this embodiment, a first photo-resist layer 260 is formed over the anti-reflection layer 250, and defining the first photo-resist layer 260 to be a deep pattern area. Dry etching of the deep pattern is carried out by means of the first photo-resist layer 260 as the mask, and punch through in turn the anti-reflection layer 250, the second inter-metal dielectric layer 240, the etch stop layer 230 and the first inter-metal dielectric layer 220 to form a via hole 265, then, the first photo-resist layer 260 is removed, as shown in FIG. 2C.

Figure 2D:
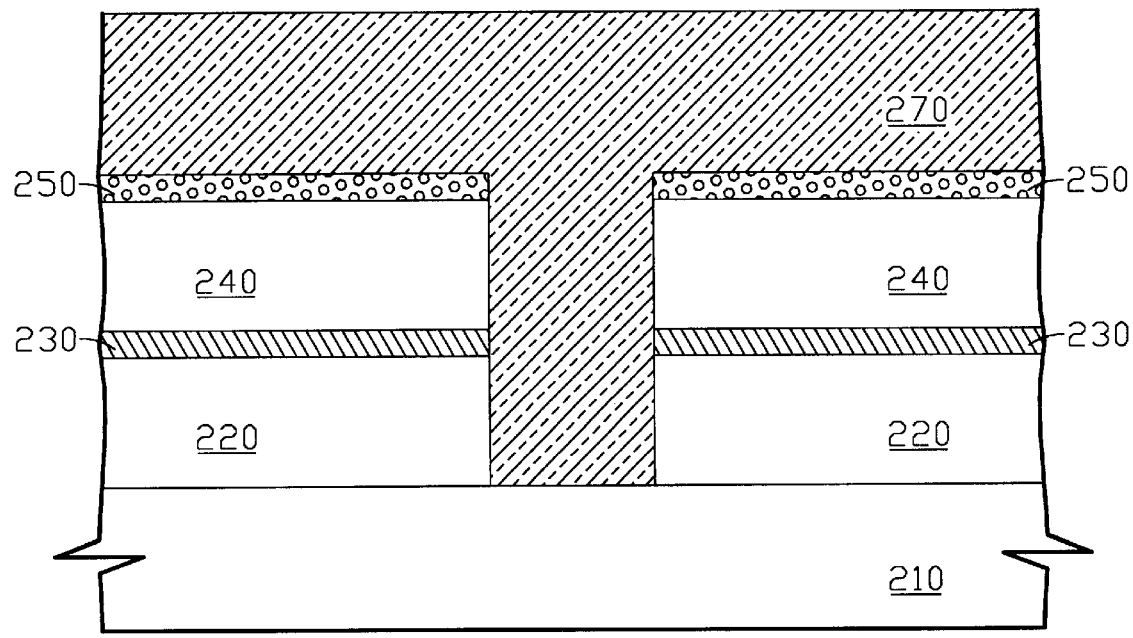
Figure 2E:
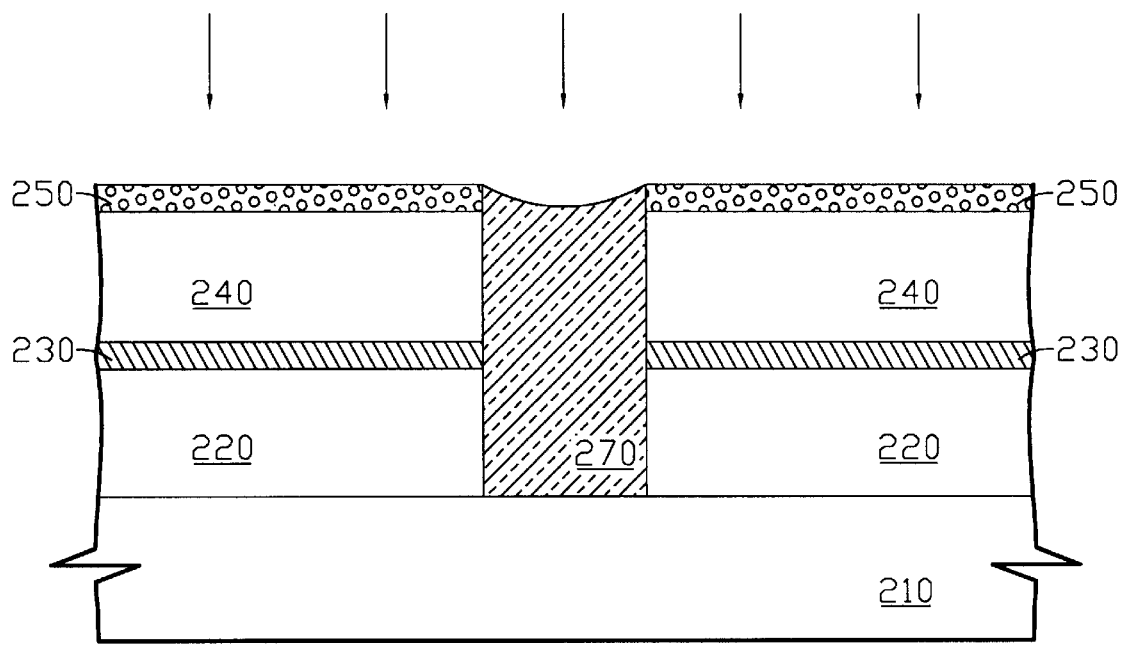
Figure 2F:
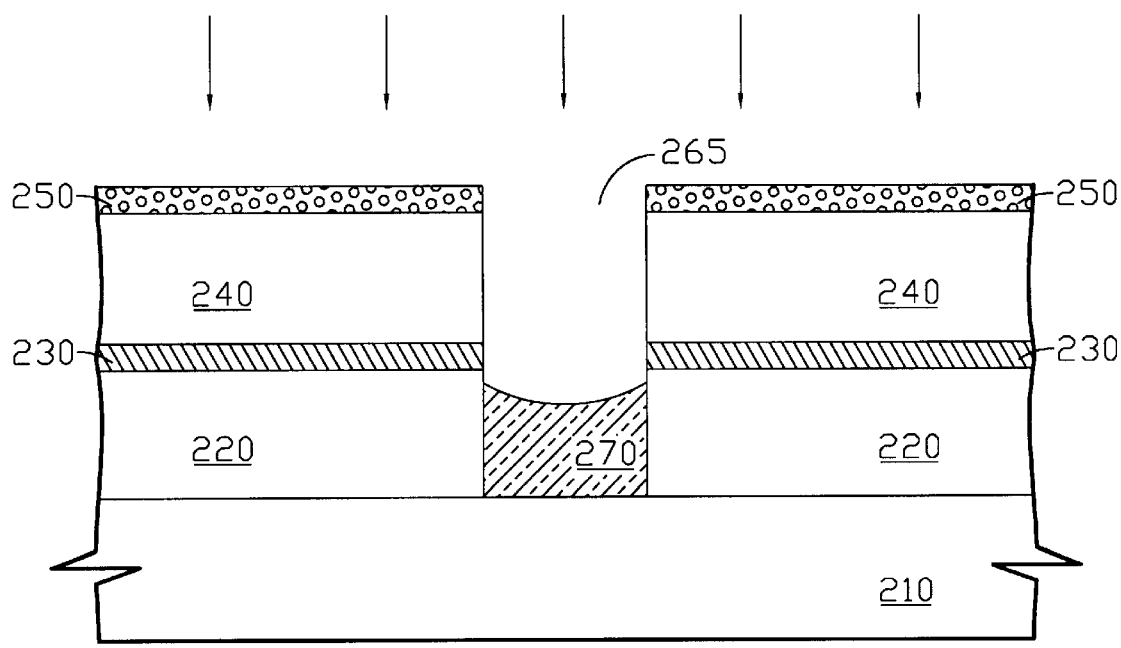

Referring to FIG. 2D, in this embodiment, a gap-filling material is filled on the anti-reflection layer 250 and into the via hole 265 to form the photo-resist plug 270, the gap-filling material is organic photo-resist material, such as I-line or DUV. Subsequently, carrying out the etching back to the photo-resist plug 270, as shown in FIG. 2E. Then, turn on the end point and applying the long over etching to make sure the photo-resist plug 270 thickness is below middle stop layer 230, as shown in FIG. 2F.

Figure 2G:
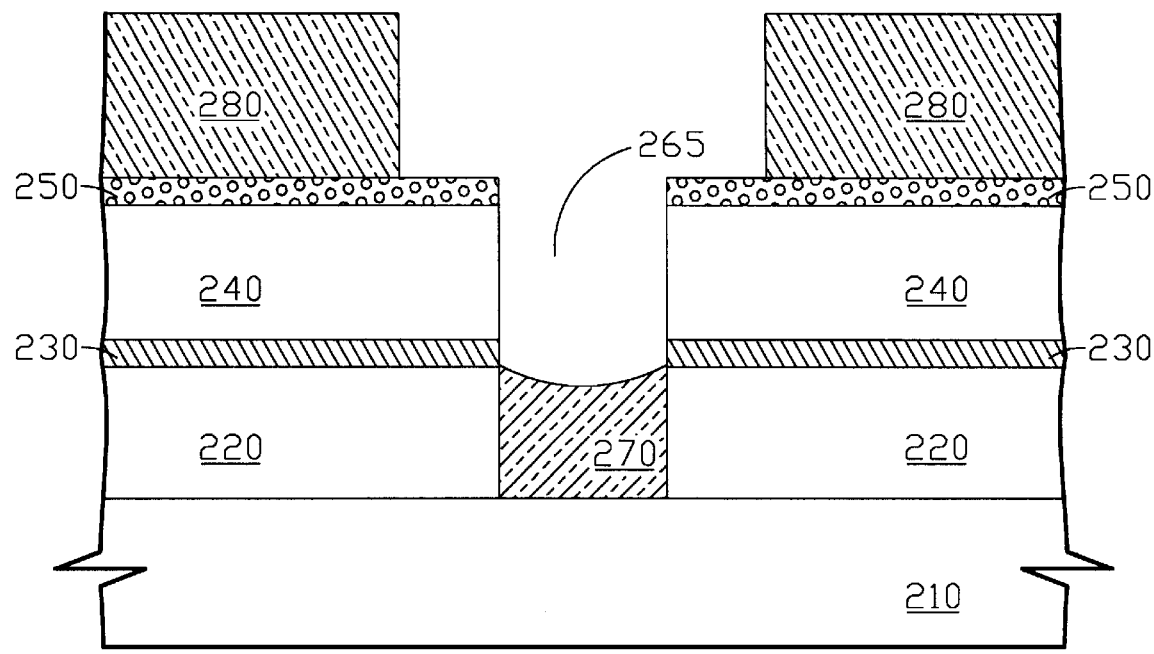
Figure 2H:
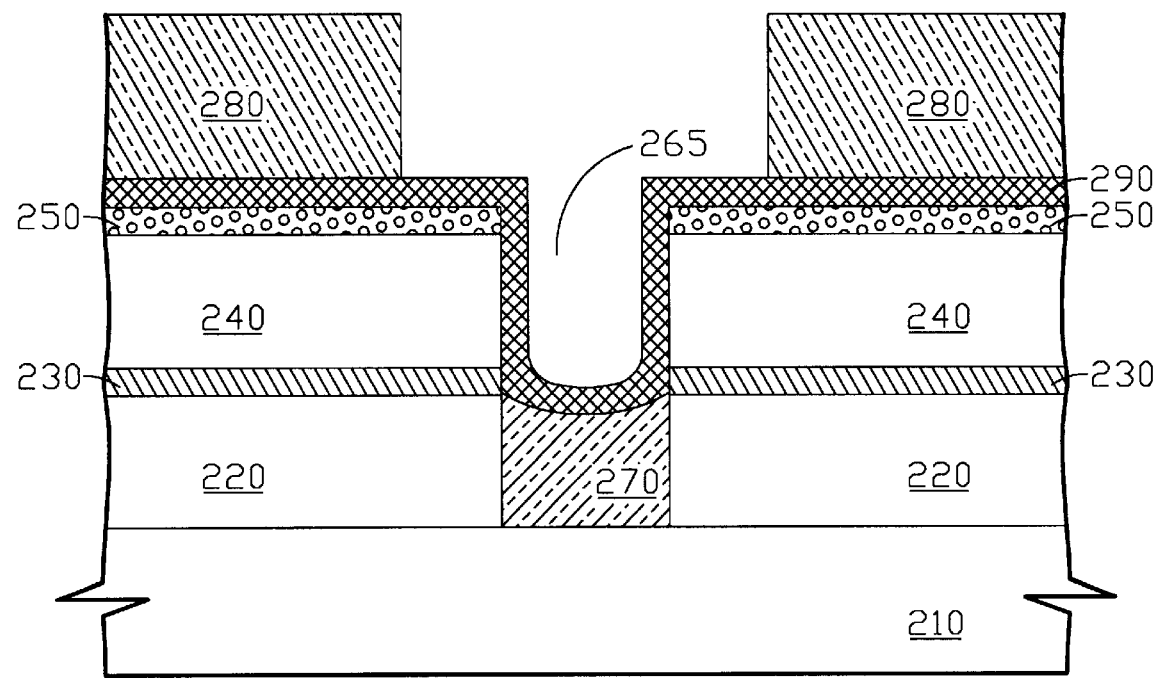
Figure 21:
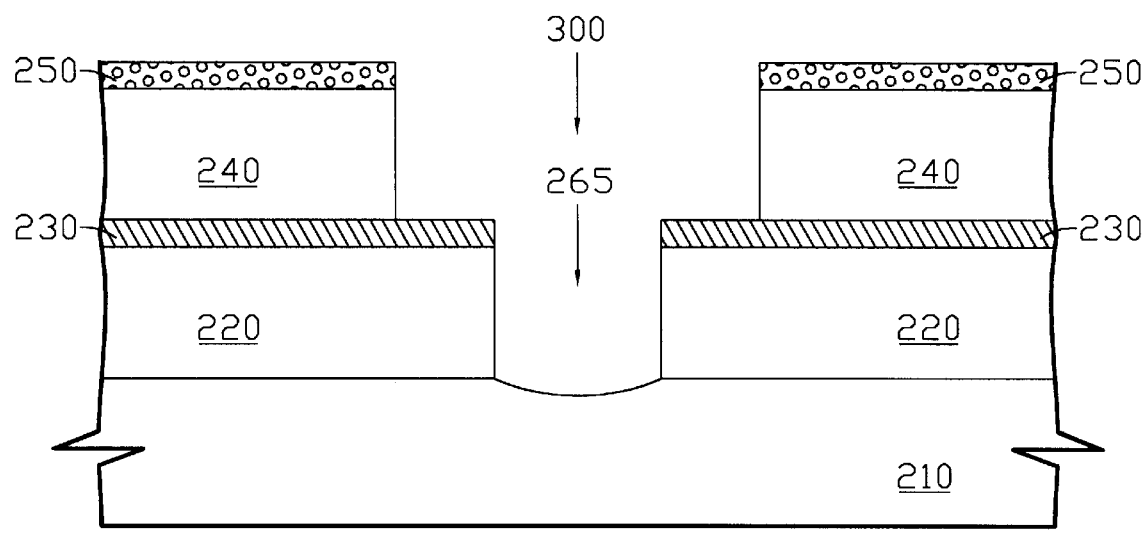

Referring to FIG. 2H, in this embodiment, if the inter-metal dielectric layers 220 and 240 will react with the second photo-resist layer 280 that will being formed during pattern define process, a barrier layer 290 is conformably formed along the surface of the anti-reflection layer 250, the surface of the at the via hole 265, and the surface of the photo-resist plug 270 on the via 265 bottom before the trench is patterned, the barrier layer uses such as bottom anti-reflection coating or a thin oxide layer. Then, a second photo-resist layer 280 is formed on the barrier layer 290, and the second photo-resist layer 280 is defined to form a shallow pattern area and to expose the via hole 265 and the partial surface of the barrier layer 290. Carrying out a dry etching process by using the second photo-resist layer 280 as a mask, and etching stop layer 230 being as an etching terminal point to remove exposed partial surface of the barrier layer 290 so as to form a trench 300 having large horizontal size than the via hole 265. Then, the second photo-resist layer 280, the barrier layer 290 and photo-resist plug 270 in the via hole 265 are removed to form an opening of the damascene, as shown in FIG. 2I.

Referring to FIG. 2G, in this embodiment, if the inter-metal dielectric layers 220 and 240 will not react with the second photo-resist layer 280 that will being formed during pattern define process, a second photo-resist layer 280 is formed on the anti-reflection layer 250 directly, and the second photo-resist layer 280 is defined to form a shallow pattern area and to expose the via hole 265 and the partial surface of the bottom anti-reflection layer 250. Carrying out a dry etching process by using the second photo-resist layer 280 as a mask, and etching stop layer 230 being as an etching terminal point to remove exposed partial surface of bottom anti-reflection layer 250 so as to form a trench 300 having large horizontal size than the via hole 265. Then, the second photo-resist layer 280 and photo-resist plug 270 in the via hole 265 are removed to form an opening of the damascene, as shown in FIG. 2I.

In this embodiment of the present invention, a new pattern method of the dual damascene is provided. The method of the present invention can avoid to product the facet and photo-resist residue in the via hole by forming the photo-resist plug, so as to prevent photo-resist residue become hard mask during the trench etching. Hence, some oxide residue like as crown is not formed at the bottom of the via hole. The present invention is that avoid over etching the via bottom and destroying the desire conduct electricity area by means of filling the gap-filling material in the via hole, and the barrier at the via bottom can be further thin down without any trench etch recipe tuning. Thus, the method of the present invention can efficiently raise quality of the process. Therefore, the method of the present invention is easily and to conform to the economic effect. Method of the present invention is the best low-K dual damascene compatible process for deep sub-micro process.

Obviously, many modifications and variations of the present invention are possible in light of the above teachings. It is therefore to be understood that within the scope of the appended claims, the present invention may be practiced otherwise than as specifically described herein.

A preferred embodiment of the present invention will now be described in greater detail. Nevertheless, it should be recognized that the present invention can be practiced in a wide range of other embodiments besides those explicitly described, and the scope of the present invention is expressly not limited except as specified in the accompanying claims.

What is claimed is:

1. A method of patterning a dual damascene structure, comprising:
   providing a substrate;
   forming a first dielectric layer on said substrate;
   forming an etching stop layer on said first dielectric layer;
   forming a second dielectric layer on said etching stop layer;
   forming an anti-reflection layer on said second dielectric layer;
   forming a first photoresist layer having a first pattern on said anti-reflection layer;
   etching portions of said anti-reflection layer, said second dielectric layer, said etching stop layer and said first dielectric layer to form a via hole by using said first photoresist layer as a mask;
   removing said first photoresist layer;
   filling a gap-filling material on said anti-reflection layer and into said via hole;
   etching back said gap-filling material until said etching stop layer to expose surface of said second dielectric layer on said via hole, and therefore to form a photo-resist plug disposed below said etching stop layer;
   forming a barrier layer;
   forming a second photoresist layer having a second pattern on said barrier layer;
   etching portions of said barrier layer to form a trench having larger lateral size than said via hole;
   removing said second photoresist layer;
   removing said barrier layer; and
   removing said photoresist plug to form an opening of a damascene.

2. The method according to claim 1, wherein said gap-filling material comprises organic photoresist material.

3. The method according to claim 1, wherein said etching step to form said via hole is a dry etching.

4. The method according to claim 1, wherein said photoresist plug is formed by said etching back with dry etching method.

5. The method according to claim 1, wherein said barrier layer is formed by conformably forming along the surface of said anti-reflection layer, the side walls of said first dielectric layer and said etching stop layer, and the surface of said photoresist plug at said via hole.

6. The method according to claim 1, wherein said barrier layer comprises bottom anti-reflection coating material or oxide.

7. The method according to claim 1, wherein said trench is formed by said second photoresist layer as a mask to proceed dry etching of said second pattern and to removed said barrier layer until etching to stop on said etching stop layer.

8. A method of patterning a dual damascene structure, comprising:
   providing a substrate;
   forming a first dielectric layer on said substrate;
   forming an etching stop layer on said first dielectric layer;
   forming a second dielectric layer on said etching stop layer;
   forming an anti-reflection layer on said second dielectric layer;
   forming a first photoresist layer having a first pattern on said anti-reflection layer;
   etching portions of said anti-reflection layer, said second dielectric layer, said etching stop layer and said first dielectric layer to form a via hole by using said first photoresist layer as a mask;
   removing said first photoresist layer;
   filling a gap-filling material on said anti-reflection layer and into said via hole;
   etching back said gap-filling material until said etching stop layer to expose surface of said second dielectric layer on said via hole, and therefore to form a photo-resist plug disposed below said etching stop layer;
   forming a second photoresist layer having a second pattern on said anti-reflection layer;
   etching portions of said anti-reflection layer to form a trench having larger lateral size than said via hole;
   removing said second photoresist layer; and
   removing said photoresist plug to form an opening of a damascene.

9. The method according to claim 8, wherein said gap-filling material comprises organic photoresist material.

10. The method according to claim 8, wherein said etching step to form said via hole is a dry etching.

11. The method according to claim 8, wherein said photoresist plug is formed by etching back with dry etching method.

12. The method according to claim 8, wherein said trench is formed by said second photoresist layer as a mask to proceed dry etching of said second pattern and to removed said anti-reflection layer until etching to stop on said etching stop layer.

* * * * *